United States Patent
Roth

(10) Patent No.: US 11,557,490 B2
(45) Date of Patent: Jan. 17, 2023

(54) METHOD FOR PRODUCING A METAL-CERAMIC SUBSTRATE WITH AT LEAST ONE VIA

(71) Applicant: Infineon Technologies AG, Neubiberg (DE)

(72) Inventor: Alexander Roth, Zeitlarn (DE)

(73) Assignee: Infineon Technologies AG, Neubiberg (DE)

(*) Notice: Subject to any disclaimer, the term of this patent is extended or adjusted under 35 U.S.C. 154(b) by 134 days.

(21) Appl. No.: 17/008,763

(22) Filed: Sep. 1, 2020

(65) Prior Publication Data
US 2020/0395225 A1    Dec. 17, 2020

Related U.S. Application Data

(62) Division of application No. 15/688,307, filed on Aug. 28, 2017, now Pat. No. 10,796,929.

(30) Foreign Application Priority Data

Aug. 29, 2016 (EP) .................................... 16001878

(51) Int. Cl.
*H01L 21/48* (2006.01)
*C04B 35/645* (2006.01)
(Continued)

(52) U.S. Cl.
CPC ........ *H01L 21/486* (2013.01); *C04B 35/6455* (2013.01); *C04B 37/021* (2013.01);
(Continued)

(58) Field of Classification Search
CPC ... H01L 21/486; H01L 21/4882; H01L 23/15; H01L 23/3735; H01L 23/49827;
(Continued)

(56) References Cited

U.S. PATENT DOCUMENTS 3,122,449 A * 2/1964 Swanson ................. C23C 18/40
                                                        427/97.8
4,483,810 A   11/1984 Bunk et al.
(Continued)

FOREIGN PATENT DOCUMENTS

CN            1875481            12/2006
CN         103178044 A  *   6/2013   ........... H01L 21/486
(Continued)

OTHER PUBLICATIONS

"Common knowledge evidence 1", from Japanese publication "Intermediary Guide to Classification of the Elements" of the "Seminars on Intermediary Engineering", Dec. 2009, pp. 1-6.
(Continued)

*Primary Examiner* — Jeffrey T Carley
(74) *Attorney, Agent, or Firm* — Murphy, Bilak & Homiller, PLLC

(57) ABSTRACT

A method for producing a metal-ceramic substrate with electrically conductive vias includes: attaching a first metal layer in a planar manner to a first surface side of a ceramic layer; after attaching the first metal layer, introducing a copper hydroxide or copper acetate brine into holes in the ceramic layer delimiting a via, to form an assembly; converting the copper hydroxide or copper acetate brine into copper oxide; subjecting the assembly to a high-temperature step above 500° C. in which the copper oxide forms a copper body in the holes; and after converting the copper hydroxide or copper acetate brine into the copper oxide, attaching a second metal layer in a planar manner to a second surface side of the ceramic layer opposite the first surface side. The copper body produces an electrically conductive connection between the first and the second metal layers.

11 Claims, 3 Drawing Sheets

(51) Int. Cl.
*C04B 37/02* (2006.01)
*H05K 3/40* (2006.01)
*C04B 41/00* (2006.01)
*C04B 41/51* (2006.01)
*C04B 41/88* (2006.01)
*H01L 23/15* (2006.01)
*H01L 23/373* (2006.01)
*H01L 23/498* (2006.01)
*H05K 1/03* (2006.01)
*H05K 3/02* (2006.01)

(52) U.S. Cl.
CPC .......... *C04B 37/026* (2013.01); *C04B 41/009* (2013.01); *C04B 41/5127* (2013.01); *C04B 41/88* (2013.01); *H01L 21/4807* (2013.01); *H01L 21/4882* (2013.01); *H01L 23/15* (2013.01); *H01L 23/3735* (2013.01); *H01L 23/49827* (2013.01); *H01L 23/49866* (2013.01); *H05K 3/4061* (2013.01); *C04B 2235/606* (2013.01); *C04B 2237/121* (2013.01); *C04B 2237/124* (2013.01); *C04B 2237/343* (2013.01); *C04B 2237/366* (2013.01); *C04B 2237/368* (2013.01); *C04B 2237/402* (2013.01); *C04B 2237/407* (2013.01); *C04B 2237/62* (2013.01); *H05K 1/0306* (2013.01); *H05K 3/022* (2013.01)

(58) Field of Classification Search
CPC ......... H01L 23/49866; C04B 2237/343; C04B 41/009; C04B 41/5127; H05K 1/0306; H05K 3/022
See application file for complete search history.

(56) References Cited

U.S. PATENT DOCUMENTS

| | | | | |
|---|---|---|---|---|
| 4,623,482 A * | 11/1986 | Kuo | ........ | H05K 1/092 428/209 |
| 4,942,076 A * | 7/1990 | Panicker | ........ | H01L 23/055 428/209 |
| 5,102,749 A | 4/1992 | Enloe et al. | | |
| 5,658,835 A | 8/1997 | Onitani et al. | | |
| 5,977,490 A | 11/1999 | Kawakita et al. | | |
| 6,207,221 B1 * | 3/2001 | Schulz-Harder | .... | H01L 21/4839 430/315 |
| 6,270,601 B1 * | 8/2001 | Ritland | ........ | H01L 23/10 156/89.18 |
| 6,316,100 B1 | 11/2001 | Kodas et al. | | |
| 6,413,620 B1 * | 7/2002 | Kimura | ........ | H05K 3/20 428/209 |
| 7,482,638 B2 * | 1/2009 | Wall, Jr. | ........ | H01L 33/64 438/22 |
| 2001/0036506 A1 | 11/2001 | Yamamoto et al. | | |
| 2005/0121768 A1 * | 6/2005 | Edelstein | ........ | H01L 23/49827 257/E23.067 |
| 2007/0007033 A1 | 1/2007 | Das et al. | | |
| 2007/0256562 A1 * | 11/2007 | Routkevitch | ........ | C01B 3/12 96/11 |
| 2008/0268637 A1 | 10/2008 | Inaba | | |

FOREIGN PATENT DOCUMENTS

| | | | | |
|---|---|---|---|---|
| DE | 4103294 A1 | 8/1992 | | |
| DE | 102010025311 A1 | 12/2011 | | |
| DE | 102010023637 B4 | 1/2012 | | |
| EP | 0085914 A2 | 8/1983 | | |
| EP | 0627875 A1 | 12/1994 | | |
| EP | 0862209 A2 | 9/1998 | | |
| EP | 1478216 A1 | 11/2004 | | |
| EP | 1403229 B1 | 3/2014 | | |
| JP | 2008109062 A * | 5/2008 | | |
| TW | 345765 B | 11/1998 | | |
| WO | WO-9515816 A1 * | 6/1995 | ........ | B01J 21/063 |
| WO | WO-0021904 A1 * | 4/2000 | ........ | C04B 37/025 |

OTHER PUBLICATIONS

"Common knowledge evidence 2", from Inorganic and Analytical Chemistry(Chinese Edition), Dec. 2009, pp. 1-9.

* cited by examiner

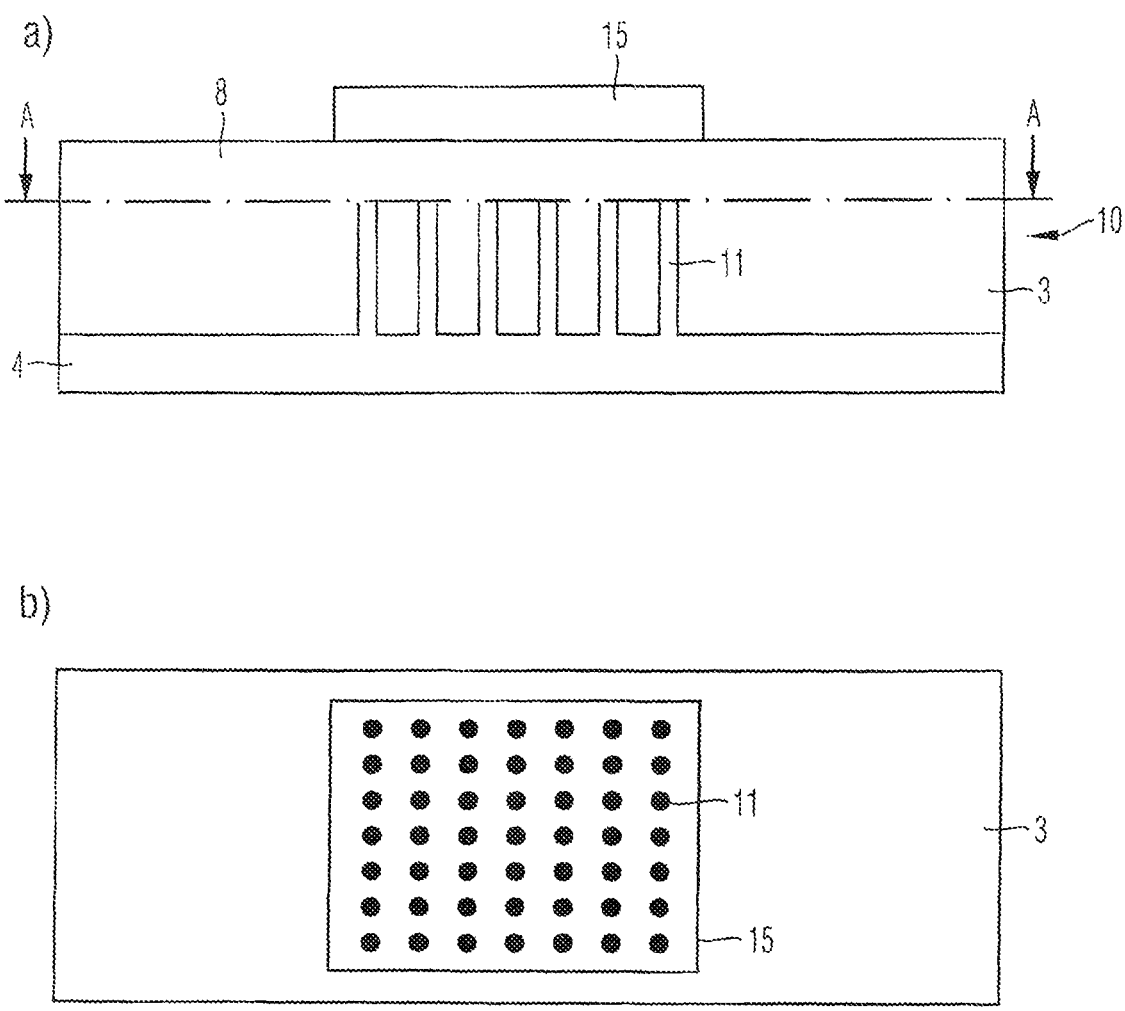

METHOD FOR PRODUCING A METAL-CERAMIC SUBSTRATE WITH AT LEAST ONE VIA

TECHNICAL FIELD

The present invention relates to a method for producing a metal-ceramic substrate, in particular a ceramic substrate metallized on both sides, with at least one electrically conductive.

BACKGROUND

Such metal-ceramic substrates are preferably used in the field of power semiconductor modules. In the process, a ceramic substrate, e.g. aluminum-oxide ceramics, is provided on its top and bottom sides with a metallization, wherein, generally, at least one metallized side later has a circuit structure that is generated by means of etching processes, for example. The known method for producing these ceramic substrates metallized on both sides is performed by means of eutectic bonding, and is generally referred to as the direct bonding process.

A basic description of a method for producing metallized ceramic substrates by bonding processes is available from EP 0 085 914 A2, for example. In the context of the direct copper bonding process (DCB process), for example, a copper sheet is first oxidized so as to result in a substantially uniform copper oxide layer. The resulting copper sheet is then positioned on a surface side of a ceramic substrate, and the composite of the ceramic substrate and the copper sheet is heated to a bonding temperature between about 1025° C. and 1083° C., which results in the formation of a metallized ceramic substrate. Finally, the metallized ceramic substrate is cooled off.

Further, EP 1 403 229 B1 describes a method for producing an aluminum-ceramic composite substrate in which, instead of copper, an aluminum plate is attached to at least one surface side of an aluminum oxide or aluminum nitride ceramic substrate.

The production of ceramic substrates metallized on both sides can either take place via a two-stage bonding process, in which, first, a first surface side of the ceramic substrate is metallized, and then a second surface side of the ceramic substrate opposite from the first surface side is metallized, or alternatively via a single-stage bonding process in which both surface sides of the ceramic substrate are metallized simultaneously.

For example, DE 10 2010 023 637 B4 describes a method for producing ceramic substrates, which are metallized on both sides, in a single process step, wherein a first metal layer, a ceramic layer and a second metal layer are successively positioned on a carrier or a bonding aid in the indicated order, and then the two metal layers are simultaneously bonded to the ceramics in a high-temperature step in accordance with the DCB method to form a metal-ceramic substrate metallized on both sides.

Furthermore, a method for applying a metallic layer onto a layer of a ceramic material is known from DE 10 2010 025 311 A1, in which a metallic sheet or a metallic plate is bonded to the layer of the ceramic material by melting an intermediate layer of a eutectic mixture. In order to form the intermediate layer, a mixture of the metallic material, an oxide of the metallic material and aluminum oxide as a ceramic filler is introduced between the metallic sheet or the metallic plate and the ceramic layer. The coefficient of thermal expansion of the intermediate layer is adjusted by the content of the ceramic material in the mixture, so that fewer mechanical stresses arise during thermal cycles.

Vias, which establish electrically conductive connections between, for example, conductor paths, contact surfaces etc. from two different sides of a substrate, are frequently required in electronic circuit engineering.

A method for producing a metal-ceramic substrate, which consists of a ceramic substrate and two metal layers each provided on one surface side of the ceramic layer, and which has at least one via at which the metal layers are electrically connected to each other in the area of an opening in the ceramic layer through a bridge of metal, is described in EP 0 627 875 A1, for example. Into the opening in the ceramic layer delimiting the via, a metal body filling the opening completely or almost completely is inserted after the ceramic layer has already been bonded, on one surface side, to a metal layer in accordance with the DCB method. After the insertion of the metal body into the opening, the second metal layer is then attached, in a further process step, to the as yet unoccupied surface side of the ceramic layer in accordance with the DCB method, with the electrically conductive via being simultaneously produced by the metal bridge. Circular-blank-shaped, cuboid or spherical configurations are proposed for the shape of the metal body. In order to produce a reliable via, the proposed method requires the metal body to have exactly the thickness of the ceramic layer, so that after insertion into the opening, it ends flush with the surface side onto which the second metal layer is applied, or to have a size that is slightly larger than the thickness of the ceramic layer, wherein the metal body in that case must be pressed flat with a punch prior to the application of the second metal layer.

Furthermore, DE 41 03 294 A1 discloses a method for producing electrically conductive vias in ceramic substrates to whose surfaces layers of metal are attached by means of the DCB method, wherein the hole in the ceramic layer delimiting the via is completely filled with a powder containing the metal. The assembly of the ceramic layer, the powder-filled hole and the metal layers disposed at the surfaces of the ceramic layer is subjected to a single high-temperature step according to the DCB method, in which the capillary action of the metal powder draws the metal situated above the hole into it, so that the metal, in the case of very small hole diameters, fills the hole and, in the case of lager hole diameters, covers the hole walls in a firmly adhering manner.

Yet another method for producing a metal-ceramic substrate, in which a first metallization is applied to a first surface side of a ceramic layer in the form of a copper sheet using the DCB method, and a second metallization is applied to the other surface side of the ceramic layer using a paste containing the metal of this second metallization by thick-film or thin-film technology, wherein the ceramic layer has at least one opening and, during the application of the paste, it is also applied in the opening and to a surface of the first metallization exposed in the opening, is described in EP 0 862 209 A2. The paste applied to the second surface side of the ceramic layer is fired under a nitrogen atmosphere at a temperature that is very much lower in comparison to the temperature of the DCB method, in order to form the second metallization.

SUMMARY

Against this background, the present invention is based on the object of presenting a method for producing a metal-ceramic substrate with at least one electrically conductive via, which is improved with respect to the quality of the electrically conductive via, and thus of the entire metal-ceramic substrate. In the process, the method is supposed to ensure the formation of the electrical conductivity of the via and enable mass-producible vias for ceramic substrates.

It must be noted that the features cited individually in the following description can be combined with each other in any technologically meaningful manner and represent other embodiments of the invention. The description, in particular in connection with the figures, additionally characterizes and specifies the invention.

According to the invention, in a method for producing a metal-ceramic substrate with at least one electrically conductive via, one metal layer, respectively, is attached in a planar manner to a ceramic plate or a ceramic layer to each of two opposing surface sides of the ceramic layer, wherein a metal-containing, powdery and/or liquid substance is introduced into a hole in the ceramic layer delimiting the via prior to the attachment of both metal layers, or subsequent to the attachment of one of the two metal layers and prior to the attachment of the other one of the two metal layers, and this assembly is then subjected to a high-temperature step above 500° C. in which the metal-containing substance wets the ceramic layer at least partially with a wetting angle of less than 90°.

In a manner known per se, wetting or contact angle refers to the angle that a drop of liquid (in this case the metal-containing substance in the high-temperature step) forms on the surface of a solid (in this case the ceramic layer) with respect to this surface. Partial wetting generally refers to the wetting angle being less than 90°, i.e., the drop of liquid forms a round dome on the surface of the ceramic layer and does not roll off. "At least partially" includes a complete wetting in which the liquid spreads on the surface of the ceramic layer in the form of a flat disk and a macroscopic contact angle is no longer provided.

In other words, in the ceramic substrate, which is metallized on both sides in the finished state, the metal-containing substance is introduced into the hole delimiting the at least one via prior to attaching at least one of the two or both metal layers to the opposing substrate surfaces, and is then formed into a via electrically connecting the two substrate surfaces with each other, wherein the property of the metal-containing substance of at least partially wetting the ceramic layer contributes to the metal contained in the substance forming a bond with the ceramic layer.

Since at most one of the two metal layers is attached to one of the two substrate surfaces in said high-temperature step, a gas released from the metal-containing substance during the high-temperature step can escape unimpededly from the hole of the via. Thus, the formation of voids between two metal layers already applied to the substrate surfaces in the via, which affect the electrical conductivity, are reliably avoided. According to the invention, the two metal layers, or the one metal layer that is not yet attached, are/is attached to the corresponding substrate surfaces or the corresponding substrate surface of the ceramic substrate only after the via has been produced in the high-temperature step, e.g. by means of a conventional DCB method. Mass-producible vias in the ceramic substrate finally metallized on both sides can be ensured by the method according to the invention.

The hole delimiting the via may have a diameter between approximately 50 μm and approximately 2000 μm. The hole can be introduced into the ceramic layer or ceramic plate both by lasering after sintering the ceramics, or by punching the green compact prior to sintering.

According to a preferred advantageous embodiment of the invention, the one of the two metal layers is attached to one of the two surface sides of the ceramic layer, for example by the DCB method known per se, prior to the introduction of the metal-containing substance into the hole delimiting the via. Thus, the hole is already closed on one side by the first metal layer prior to the metal-containing substance being introduced into the hole, so that the metal-containing substance can be retained in the hole more easily after the introduction and a higher degree of filling of the hole with the metal-containing substance can be achieved. Preferably, the degree of filling of the hole is at least approximately 30% of the volume of the hole. A higher degree of filling improves the formation of the electrical conduction within the hole and thus between the two surface sides of the ceramic layer connected to each other through the hole.

According to another advantageous embodiment of the invention, the metal-containing substance is a powder mixture composed of copper (Cu) and additionally at least one element from the group consisting of copper(I) oxide ($Cu_2O$), copper(II) oxide (CuO) and copper(II) hydroxide ($Cu(OH)_2$), wherein the content of copper in the powder mixture is between 0% and approximately 95% and the at least one element from the aforementioned group forms the rest up to 100%.

Another advantageous embodiment of the invention provides that the grain sizes of the powder mixture are at most 90% of the diameter of the hole delimiting the via. This ensures a sufficient fillability of the hole.

For example, the powder mixture can be introduced into the hole or holes delimiting the via by shaking. This process can be carried out in a planar manner on the entire ceramic layer or plate, so that a large number of electrically conductive vias can be prepared simultaneously.

Alternatively, the powder mixture, prior to the introduction into the hole delimiting the via, can also be mixed with a carrier material to form a viscous paste, particularly preferably with a liquid that evaporates in a residue-free manner up to a temperature of approximately 400° C., such as water or an alcohol. Then, the paste can be introduced into the hole or holes in the ceramic layer by means of, for example, stencil printing, screen printing or dispenser. This process can be carried out in a planar manner on the entire ceramic layer or plate, so that a large number of electrically conductive vias can be prepared simultaneously.

The carrier material or carrier liquid can evaporate already at room temperature. In order to shorten the production times of the metal-ceramic substrate, another advantageous embodiment of the invention provides that the carrier liquid is evaporated in an additional temperature step up to a maximum of 400° C. after the introduction of the paste and prior to carrying out the high-temperature step.

According to another advantageous embodiment, a liquid is introduced into the hole delimiting the via as a metal-containing substance as an alternative or in addition to the previously described powdery substance, by the ceramic layer being sprayed with the liquid or immersed in the liquid, wherein a subsequent, additional thermal conversion step for converting the liquid into copper oxide, e.g. copper (I) oxide and/or copper(II) oxide, is carried out in a temperature range of approximately 100° C. to approximately 200° C. prior to the high-temperature step. The liquid is advantageous in that it is able to penetrate even holes with a very small diameter and adheres to the ceramic layer in the ceramic holes due to the surface tension. In the case in which one of the two metal layers is already attached to one of the two surface sides of the ceramic layer and the via hole is thus closed on one side, a liquid column filling the hole can advantageously form in the hole.

Particularly preferably, a copper(II) hydroxide brine or copper(II) acetate brine is used as the metal-containing liquid.

The two metal layers can be attached to the ceramic layer by means of the DCB method (direct copper bonding) known per se, wherein the powdery or liquid metal-containing substance can be composed as described above.

Alternatively, the two metal layers can also be attached to the ceramic layer by means of the AMB method (active metal brazing), which is also known. In this case, the AMB solder can advantageously also be used directly as the metal-containing substance.

Another embodiment of the invention, which is particularly advantageous with respect to process efficiency, provides that one of the two metal layers is attached to the ceramic layer simultaneously with the high-temperature step for wetting the ceramic layer with the metal-containing substance.

After attaching the two metal layers to the ceramic layer, the metal-ceramic substrate can be subjected to hot isostatic pressing. An internal porosity of the at least one via can thus be eliminated subsequently, and the electrical conductivity of the via can be improved or ensured.

In order to eliminate uneven portions on the external surfaces of the two metal layers, particularly on the hole delimiting the via, the ceramic substrate metallized on both sides can be ground on its external metal surfaces.

According to yet another advantageous embodiment of the invention, aluminum oxide ($Al_2O_3$) is admixed as a ceramic filler to the metal-containing substance. The coefficient of thermal expansion of a eutectic intermediate layer between the metal of the substance and the ceramic layer is adjusted by the content of the ceramic material in the metal-containing substance, so that fewer mechanical stresses arise during thermal cycles. This results in a higher reliability or longer life of the material composite produced, and thus of the electrical conductivity of the via.

BRIEF DESCRIPTION OF THE DRAWINGS

Other advantages and features of the invention become apparent from the following description as well of exemplary embodiments of the invention, which shall be understood not to be limiting and which will be explained below with reference to the drawing. In this drawing, the Figures schematically show:

FIG. 3 illustrates a metal-ceramic substrate produced with the method of FIG. 2 in a lateral sectional view (a) and a top view (b) sectioned along the section line A-A depicted in the lateral sectional view (a).

DETAILED DESCRIPTION

Figure 1:
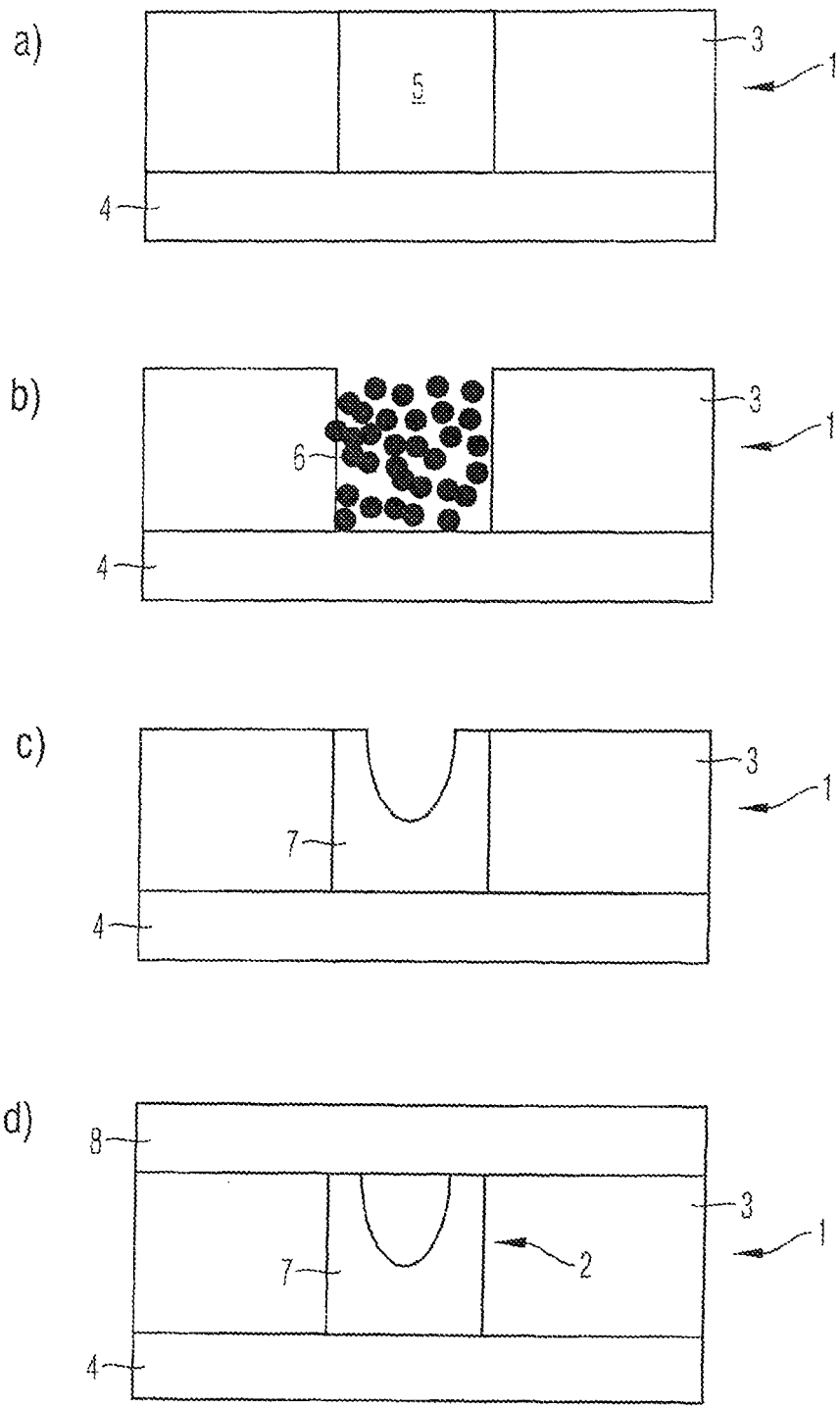
FIG. 1 illustrates four process steps (a-d) of a first exemplary embodiment of a method according to the invention.

In the different figures, parts that are equivalent with respect to their function are always provided with the same reference numerals, so that they are also only described once, as a rule.

FIG. 1 illustrates four process steps (a-d) of a first exemplary embodiment of a method according to the invention for the production of a metal-ceramic substrate 1 metallized on both sides with an electrically conductive via 2 shown in an exemplary manner in the four detailed views a) to d). In its entirety, the metal-ceramic substrate 1 has a plurality of the vias 2 shown in view d).

As is apparent from FIG. 1, the metal-ceramic substrate 1 has a ceramic plate or ceramic layer 3, such as $Al_2O_3$ or AlN ceramics. On the lower surface side of the ceramic layer 3 shown in FIG. 1, a first metal layer 4 has already been attached in a planar manner to the ceramic layer 3 prior to the process step a), for example a copper layer by means of the known DCB method. The ceramic layer 3 further has a hole 5 delimiting the electrical via 2. The hole 5 preferably has a diameter of approximately 50 µm to approximately 2000 µm. For example, it may be introduced into the ceramic layer 3 by lasering after sintering the ceramic layer 3, or by punching the green compact in a corresponding manner prior to sintering.

In the process step b) shown in FIG. 1, a metal-containing powdery substance 6 was introduced into the hole 5. In the case shown here, the metal-containing substance 6 is a powder mixture composed of copper (Cu) and additionally at least one element from the group consisting of copper(I) oxide ($Cu_2O$), copper(II) oxide (CuO) and copper(II) hydroxide ($Cu(OH)_2$), wherein the content of copper in the powder mixture is between 0% and approximately 95% and the at least one element from the aforementioned group forms the rest up to 100%.

Then, this assembly consisting of the ceramic layer 3, the metal layer 4 attached to a surface side of the ceramic layer 3 and the powder mixture 6 is subjected to a high-temperature step above 500° C., e.g. to a conventional DCB high-temperature step, in which the metal-containing substance 6 wets the inner wall of the hole 5 at least partially with a wetting angle of less than 90°, so that a material bond is formed between the ceramic layer 3 and the metal of the powder mixture 6. Process step c) in FIG. 1 depicts the state after this high-temperature step, in which the powder mixture 6 has reacted to form a (porous) copper body 7.

In a further high-temperature step, e.g. a DCB high-temperature step, a second metal layer 8 is then attached in a conventional manner to a surface side of the ceramic layer 3 opposing the first metal layer 4. In the process, the copper body 7 produces an electrically conductive connection between the two metal layers 4 and 8, as is shown in process step d) of FIG. 1.

Figure 2:
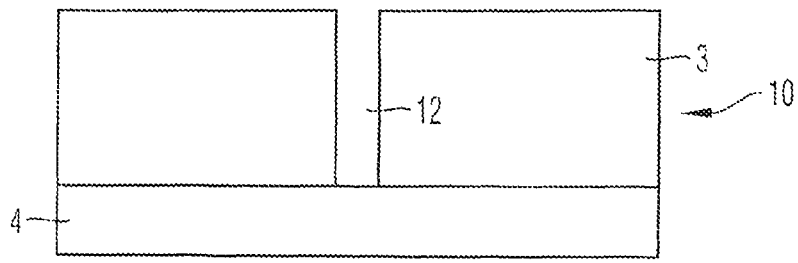
FIG. 2 illustrates four process steps (a-d) of a second exemplary embodiment of a method according to the invention.
Figure 2:
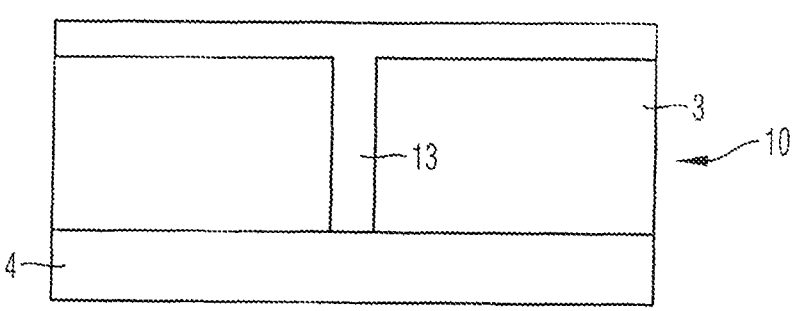
Figure 2:
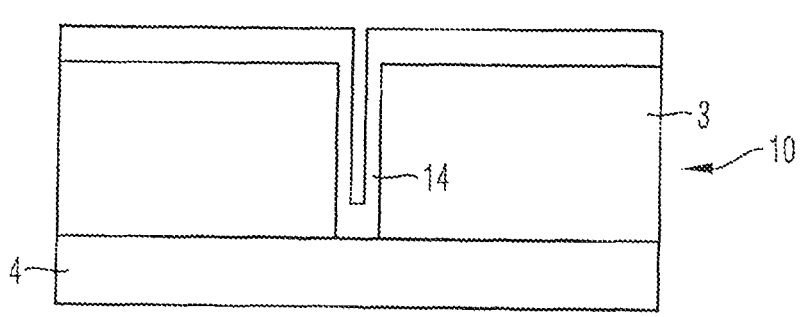
Figure 2:
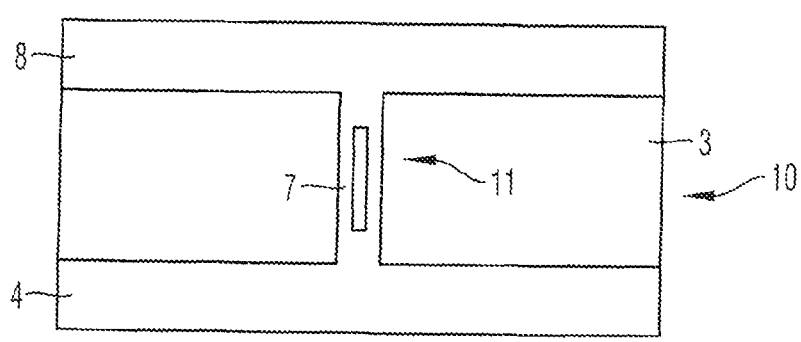

FIG. 2 illustrates four process steps (a-d) of a second exemplary embodiment of a method according to the invention for the production of a metal-ceramic substrate 10 metallized on both sides with an electrically conductive via 11 shown in an exemplary manner in the four detailed views a) to d). In its entirety, the metal-ceramic substrate 10 has a plurality of the vias 11 shown in view d).

As is apparent from FIG. 2, the metal-ceramic substrate 10 has a ceramic plate or ceramic layer 3, such as $Al_2O_3$ or AlN ceramics. On the lower surface side of the ceramic layer 3 shown in FIG. 2, a first metal layer 4 has already been attached in a planar manner to the ceramic layer 3 prior to the process step a), for example a copper layer by means of the known DCB method.

As is also apparent from process step a) of FIG. 2, the ceramic layer 3 has a hole 12 delimiting the electrical via 11, which in the case shown here has a considerably smaller diameter than the hole 5 shown in FIG. 1.

The main difference between the method shown in FIG. 2 and the method shown in FIG. 1 is that the hole 11 of the ceramic layer 3 in process step b) of FIG. 2 was treated with brine 13 instead of with a metal-containing powder mixture 6, in particular with a copper hydroxide or copper acetate brine 13, for example by spraying, immersing the ceramic layer 3 into the brine 13 or the like. Due to the surface tension, the brine 13 is drawn into the hole 12, as is shown in process step b) of FIG. 2.

Then, as shown in process step c) of FIG. 2, an additional thermal conversion step for converting the brine 13 into copper oxide 14 is carried out in a temperature range of approximately 100° C. to approximately 200° C. prior to the high-temperature step (not shown in FIG. 2) for forming a copper body 7 in the hole 12 from the copper oxide 14.

In a further high-temperature step, e.g. a DCB high-temperature step, a second metal layer 8 is finally attached in a conventional manner to a surface side of the ceramic layer 3 opposing the first metal layer 4. In the process, the copper body 7 produces an electrically conductive connection between the two metal layers 4 and 8, as is shown in process step d) of FIG. 2.

FIG. 3 illustrates the metal-ceramic substrate 10 produced with the method of FIG. 2 in a lateral sectional view (a) and a top view (b) sectioned along the section line A-A depicted in the lateral sectional view (a).

As is apparent from view (a) of FIG. 3, a semiconductor component 15 is attached to the upper metal layer 8. A plurality of vias 11, each with relatively small diameters, is disposed in a clustered manner underneath the semiconductor component 15. The clustering of the vias 11 makes it possible to ensure the same current-carrying capacity per unit area. The heat dissipation from the semiconductor component 15 can also be improved thereby. Preferably, the vias 11 are therefore disposed underneath the semiconductor component 15, whose outline is shown in view (b) of FIG. 3 as an aid for better illustration.

The above-described inventive method for producing a metal-ceramic substrate with at least one electrically conductive via is not limited to the embodiments disclosed herein, but also includes embodiments having the same effects. For example, it is conceivable directly to use, instead of the liquid sole shown in FIG. 2, a liquid AMB solder if the metallization of the ceramic layer is carried out by means of the AMB method known per se, for example.

Furthermore, the above-described invention can in principle be applied to any type of ceramic substrate, for example AlN (aluminum nitride), $Si_3N_4$ (silicon nitride), $Al_2O_3$ (aluminum oxide) and the like, which can be coated with a metal layer, e.g. Cu (copper) or Al (aluminum) or an alloy thereof. In the process, the metallization can be applied to two opposing surface sides of the substrate by means of different methods, e.g. by AMB (active metal brazing), DCB (direct copper bonding), DAB (direct aluminum bonding), thick-film methods and the like. DCB and AMB ceramic substrates are particularly preferred. Here, the term "substrate" is used as a synonym for all of the above-mentioned types of substrate.

In a preferred embodiment, the metal-ceramic substrate produced by means of the method according to the invention is used for the fabrication of electric circuits, particularly of power circuits.

With the above range of variations and applications in mind, it should be understood that the present invention is not limited by the foregoing description, nor is it limited by the accompanying drawings. Instead, the present invention is limited only by the following claims and their legal equivalents.

LIST OF REFERENCE NUMERALS

1 Metal-ceramic substrate
2 Via
3 Ceramic layer
4 First metal layer
5 Hole
6 Powdery metal-containing substance
7 Copper body
8 Second metal layer
10 Metal-ceramic substrate
11 Via
12 Hole
13 Brine
14 Brine converted into copper oxide
15 Semiconductor component

What is claimed is:

1. A method for producing a metal-ceramic substrate with a plurality of electrically conductive vias, the method comprising:
   attaching a first metal layer in a planar manner to a first surface side of a ceramic layer and attaching a second metal layer in a planar manner to a second surface side of the ceramic layer opposite the first surface side;
   introducing a copper hydroxide or copper acetate brine into a plurality of holes in the ceramic layer, with each of the plurality of holes delimiting one of the plurality of electrically conductive vias, prior to the attachment of both the first and the second metal layers, or subsequent to the attachment of one of the first and the second metal layers and prior to the attachment of the other one of the first and the second metal layers, to form an assembly;
   converting the copper hydroxide or copper acetate brine into copper oxide; and
   subjecting the assembly to a high-temperature step above 500° C. in which the copper oxide forms a copper body in the plurality of holes.

2. The method of claim 1, wherein introducing the copper hydroxide or copper acetate brine into the plurality of holes comprises:
   spraying the ceramic layer with the copper hydroxide or copper acetate brine.

3. The method of claim 1, wherein introducing the copper hydroxide or copper acetate brine into the plurality of holes comprises:
   immersing the ceramic layer in the copper hydroxide or copper acetate brine.

4. The method of claim 1, wherein converting the copper hydroxide or copper acetate brine into the copper oxide comprises:
   before subjecting the assembly to the high-temperature step, converting the copper hydroxide or copper acetate brine into the copper oxide by thermal conversion in a temperature range between 100° C. and 200° C.

5. The method of claim 1, wherein the ceramic layer comprises an $Al_2O_3$, AlN or $Si_3N_4$ ceramic.

6. The method of claim 1, wherein a semiconductor component is attached to the second metal layer.

7. The method of claim 6, wherein the via is disposed underneath the semiconductor component.

8. The method of claim 1, wherein the copper body produces an electrically conductive connection between the first and the second metal layers.

9. The method of claim 1, wherein the first and the second metal layers are attached to the ceramic layer by a direct copper bonding (DCB) method.

10. The method of claim 1, wherein the first and the second metal layers are attached to the ceramic layer by an active metal brazing (AMB) method.

11. The method of claim 6, wherein the plurality of electrically conductive vias is disposed in a clustered manner underneath the semiconductor component.

\* \* \* \* \*